United States Patent
Takashima et al.

(10) Patent No.: US 12,259,652 B2
(45) Date of Patent: Mar. 25, 2025

(54) PHOTOSENSITIVE DRY FILM, AND PRINTED WIRING BOARD WITH PHOTOSENSITIVE DRY FILM

(71) Applicant: TAMURA CORPORATION, Tokyo (JP)

(72) Inventors: Ryoya Takashima, Iruma (JP); Masanobu Ishizaka, Iruma (JP); Shinji Imai, Iruma (JP)

(73) Assignee: TAMURA CORPORATION, Tokyo (JP)

( * ) Notice: Subject to any disclaimer, the term of this patent is extended or adjusted under 35 U.S.C. 154(b) by 487 days.

(21) Appl. No.: 17/408,307

(22) Filed: Aug. 20, 2021

(65) Prior Publication Data

US 2022/0066322 A1   Mar. 3, 2022

(30) Foreign Application Priority Data

Aug. 26, 2020 (JP) .................. 2020-142991
Aug. 4, 2021 (JP) .................. 2021-127896

(51) Int. Cl.

| G03F 7/11 | (2006.01) |
|---|---|
| G03F 7/027 | (2006.01) |
| G03F 7/033 | (2006.01) |
| G03F 7/038 | (2006.01) |
| G03F 7/30 | (2006.01) |
| H05K 3/00 | (2006.01) |
| H05K 3/28 | (2006.01) |

(52) U.S. Cl.
CPC .............. *G03F 7/027* (2013.01); *G03F 7/033* (2013.01); *G03F 7/0385* (2013.01); *G03F 7/11* (2013.01); *G03F 7/30* (2013.01); *H05K 3/0023* (2013.01); *H05K 3/281* (2013.01); *H05K 3/287* (2013.01)

(58) Field of Classification Search
CPC .......... G03F 7/027; G03F 7/032; G03F 7/038; G03F 7/033; G03F 7/30; G03F 7/40
See application file for complete search history.

(56) References Cited

U.S. PATENT DOCUMENTS

| 4,559,292 A * | 12/1985 | Geissler ................. G03F 7/346 |
|---|---|---|
| | | 430/258 |
| 2013/0256017 A1* | 10/2013 | Okamoto ............... B32B 27/08 |
| | | 156/60 |
| 2013/0260109 A1* | 10/2013 | Akiyama ............... G03F 7/029 |
| | | 174/255 |
| 2015/0044509 A1* | 2/2015 | Kunimoto ............ C07D 333/46 |
| | | 549/497 |
| 2015/0382473 A1 | 12/2015 | Okamoto et al. |

FOREIGN PATENT DOCUMENTS

| JP | 2016027363 A | 2/2016 |
|---|---|---|
| JP | 2016027435 A | 2/2016 |
| JP | 2017191336 A | 10/2017 |
| JP | 2018116255 A | 7/2018 |
| JP | 2018124532 A | 8/2018 |
| TW | 201601608 A | 1/2016 |
| TW | 201942171 A | 11/2019 |

OTHER PUBLICATIONS

[English Translation] Decision to Grant a Patent mailed on Dec. 14, 2021 for Japanese Patent Application No. 2021-127896.
[English Translation] Notice of Reasons for Refusal mailed on Oct. 27, 2021 for Japanese Patent Application No. 2021-127896.
[English Translation] First Office Action for Taiwanese Patent Application No. 110131427, dated Dec. 6, 2024, pp. all.

* cited by examiner

*Primary Examiner* — John S. Chu

(74) *Attorney, Agent, or Firm* — Dorsey & Whitney LLP

(57) ABSTRACT

The present disclosure provides a photosensitive dry film enabling a photocured film being excellent in insulation reliability and resolution and having a frosted appearance to be obtained. A photosensitive dry film including a support film having a first main surface and a second main surface opposite to the first main surface, and a photosensitive resin layer provided on the first main surface, in which the first main surface has an irregular surface formed by chemical etching.

6 Claims, No Drawings

PHOTOSENSITIVE DRY FILM, AND PRINTED WIRING BOARD WITH PHOTOSENSITIVE DRY FILM

CROSS REFERENCE TO RELATED APPLICATIONS

This application claims the benefit of Japanese Patent Application No. 2020-142991, filed Aug. 26, 2020 and Japanese Patent Application No. 2021-127896, filed Aug. 4, 2021, which is hereby incorporated by reference in its entirety.

BACKGROUND

Technical Field

The present disclosure relates to a photosensitive dry film enabling a covering material, in particular, a covering material having a frosted appearance and being excellent in resolution and insulation reliability to be formed, and a method for producing a printed wiring board provided with a covering material formed, by using a photosensitive dry film.

Background

A circuit pattern of a conductor (for example, copper foil) is formed on, for example, a printed wiring board with a rigid substrate or a flexible printed wiring board with a flexible substrate. An electronic component is installed on a soldering land of such a circuit pattern by soldering, and a circuit section except for such a soldering land is covered with an insulating film (for example, a solder resist film) serving as a protective film. Such an insulating protective film here used may be a photocured film of a photosensitive resin composition containing a photosensitive resin and a photopolymerization initiator.

Examples of a method for forming the insulating protective film on a substrate include use of a photosensitive dry film. The photosensitive dry film can be produced by coating a support film made of a resin such as polyethylene terephthalate with the photosensitive resin composition to thereby form a coating film, drying the coating film to thereby form a solder resist layer on the support film, and thereafter stacking a covering film on the solder resist layer formed. The solder resist layer is formed on a printed wiring board by bonding the solder resist layer and the printed wiring board while releasing the covering film of the photosensitive dry film. Thereafter, the solder resist layer is exposed to ultraviolet light from above the support film and thus subjected to a photocuring treatment, and furthermore subjected to a thermal curing treatment, to thereby enable the insulating protective film to be formed on the printed wiring board.

In this regard, the insulating protective film of the photosensitive resin composition may be required to have a frosted appearance depending on usage conditions of the protective film, for example, impartment of a sense of luxury. In order to form an insulating protective film having a frosted appearance by using the photosensitive dry film, a support film of the photosensitive dry film is subjected to roughening processing and the support film subjected to roughening processing is coated with the photosensitive resin composition, to thereby transfer surface roughness onto a surface of the insulating protective film.

A photosensitive dry film for use in formation of a solder resist layer has been proposed as a technology for transferring surface roughness onto a surface of the insulating protective film, and the photosensitive dry film includes a support film and a photosensitive resin layer provided on one surface of the support film, in which a surface of the support film, on which the photosensitive resin layer is provided, has an arithmetic average surface roughness Ra of 100 to 390 nm (Japanese Patent Application Laid-Open No. 2016-27363). It has been preferable in Japanese Patent Application Laid-Open No. 2016-27363 to use, as the support film, a thermoplastic resin film (kneaded matte film with a filler kneaded in a thermoplastic resin) obtained by formation of a film of a resin composition including a thermoplastic resin and a filler.

However, a support film produced from a resin composition including a filler may cause a rough state of a surface of the support film to be not sufficiently uniformed. If a support film having a surface whose rough state is not sufficiently uniformed is used to form an insulating protective film having a frosted appearance, a rough state of a surface of the insulating protective film is not sufficiently uniformed and no insulating protective film having a sufficient frosted appearance may be obtained. If a rough state of a surface of the support film is not sufficiently uniformed, diffuse reflection of light occurs in light exposure due to a non-uniform haze of the support film, to result in halation of light, thereby also photocuring a section on a coating film, to be removed by development, and thus a pattern on an insulating protective film cannot be sometimes increased in resolution. An insulating protective film having a surface non-uniformed may result in a reduction in insulation reliability of the insulating protective film.

It has also been proposed to obtain a frosted appearance of a photocured film by using a support film subjected to a coating treatment of one surface of the film and provided with an intermediate layer integrated with the support film (Japanese Patent Application Laid-Open No. 2018-116255). In Japanese Patent Application Laid-Open No. 2018-116255, the intermediate layer formed by conducting the coating treatment corresponds to a roughening agent and the intermediate layer acts to thereby impart a frosted appearance to the photocured film.

However, in Japanese Patent Application Laid-Open No. 2018-116255, the intermediate layer is formed on the support film and thus light applied in exposure is diffusely reflected on the support film by a haze or the like due to the intermediate layer, thereby not sometimes enabling a pattern on an insulating protective film to be increased in resolution.

It has also been proposed to form a rough surface on a support film surface by a blast treatment of the support film surface. However, use of a support film subjected to the blast treatment causes an insulating protective film to be contaminated by a blast material remaining on the support film surface in the blast treatment, thereby again not enabling an insulating protective film having a high resolution to be obtained, and sometimes resulting in a reduction in insulation reliability.

SUMMARY

The present disclosure is related to providing a photosensitive dry film enabling a photocured film being excellent in insulation reliability and resolution and having a frosted appearance to be obtained.

The gist of the configuration of the present disclosure is as follows.

[1] A photosensitive dry film including a support film having a first main surface and a second main surface opposite to the first main surface, and a photosensitive resin layer provided on the first main surface, wherein
   the first main surface has an irregular surface formed by chemical etching.

[2] The photosensitive dry film according to [1], wherein an arithmetic average surface roughness Sa of the irregular surface of the first main surface is 0.10 μm or more and 1.00 μm or less.

[3] The photosensitive dry film according to [1] or [2], wherein the second main surface has no irregular surface formed by chemical etching.

[4] The photosensitive dry film according to any one of [1] to [3], wherein the photosensitive resin layer is formed from a photosensitive resin composition, and the photosensitive resin composition contains an aliphatic-based urea compound.

[5] The photosensitive dry film according to [4], wherein the photosensitive resin composition contains a photosensitive resin (A), an epoxy compound (B), an aliphatic-based urea compound (C), a reactive diluent (D), and a photopolymerization initiator (E).

[6] The photosensitive dry film according to [5], wherein the epoxy compound (B) includes at least one selected from a bisphenol A-type epoxy resin, a biphenyl-type epoxy resin and an alicyclic epoxy resin.

[7] The photosensitive dry film according to any one of [1] to [6], for use in formation of a solder resist film.

[8] A method for producing a printed wiring board, including:
   a step of bonding the photosensitive resin layer of the photosensitive dry film according to any one of [1] to [7], to a printed wiring board,
   a step of applying ultraviolet light from above the support film of the photosensitive dry film, to photocure the photosensitive resin layer,
   a step of releasing the support film from the photosensitive dry film and developing the photosensitive resin layer photocured, to form a photocured film having a predetermined pattern, and
   a step of subjecting the photocured film having a predetermined pattern to a thermal curing treatment, to form a cured film having an irregular surface section, wherein
   an arithmetic average surface roughness Sa of the irregular surface section of the cured film is 0.10 μm or more and 1.00 μm or less.

The "arithmetic average surface roughness Sa" herein means a value measured according to ISO 25178.

According to an aspect of the photosensitive dry film, a photosensitive resin layer is provided on a first main surface having an irregular surface formed by chemical etching, and thus it is possible to obtain a photocured film being excellent in insulation reliability and resolution and having a frosted appearance.

According to an aspect of the photosensitive dry film, the irregular surface has an arithmetic average surface roughness Sa of 0.10 μm or more and 1.00 μm or less, and thus it is possible to obtain a photocured film being further excellent in insulation reliability and resolution and having a frosted appearance.

According to an aspect of the photosensitive dry film, the photosensitive resin layer is formed from a photosensitive resin composition containing an aliphatic-based urea compound, and thus it is possible to more certainly obtain a photocured film having a frosted appearance.

DETAILED DESCRIPTION

<Photosensitive Dry Film>

The photosensitive dry film of the present disclosure is described below in detail. The photosensitive dry film of the present disclosure is a photosensitive dry film including a support film having a first main surface and a second main surface opposite to the first main surface, and a photosensitive resin layer provided on the first main surface, wherein the first main surface has an irregular surface formed by chemical etching. The first main surface of the support film has an irregular surface formed by chemical etching, and the first main surface having the irregular surface is coated with a photosensitive resin layer.

[Support Film]

The support film has a role in not only supporting the photosensitive resin layer, but also imparting a predetermined surface form to a surface of the photosensitive resin layer, the surface being in contact with the support film, in exposure of the photosensitive resin layer.

The support film is in the form of a thin film. The support film has a first main surface (surface section at a front side) formed in the planar direction of the support film, a second main surface (surface section at a rear side) formed in the planar direction of the support film, the surface being opposite to the first main surface, and a side surface section connecting the first main surface and the second main surface, the section being formed in the thickness direction of the support film.

Only the first main surface, of the first main surface and the second main surface each formed in the planar direction of the support film, is subjected to a roughening treatment, and thus the irregular surface is formed. The first main surface is subjected to chemical etching (chemical polishing) as the roughening treatment. In other words, the irregular surface is formed on the first main surface by chemical etching. The chemical etching is a treatment involving immersing a workpiece (support film in the present disclosure) in a polishing liquid as an add solution or an alkali solution over a predetermined time, to roughen a surface of the workpiece due to the dissolution action of the polishing liquid, and thereafter washing the workpiece with water and drying the workpiece, to thereby form the workpiece roughened. The roughness of the surface of the workpiece, namely, the degree of protruding and recessing on the irregular surface can be modulated by, for example, the immersion time in the polishing liquid. Examples of the polishing liquid can include an aqueous potassium hydroxide solution, an aqueous sodium hydroxide solution, and an aqueous potassium permanganate solution. Whether the irregular surface of the first main surface is an irregular surface formed by chemical etching or an irregular surface formed by another treatment (for example, a rough surface obtained by forming a film of a resin composition including a filler, or a rough surface subjected to a blast treatment) can be determined by observing a processing state of protruding and recessing with a microscope or the like.

From the foregoing, the photosensitive dry film of the present disclosure does not use, as the support film, any film subjected to other roughening treatment, for example, a matted film (kneaded matte film) obtained by addition of a filler into a resin composition in film formation and a kneading treatment of the resin composition, a coating matte film subjected to a coating treatment for matting, or a film with a film surface subjected to a blast treatment such as a sand blast treatment.

The irregular surface formed by chemical etching has a smoothly rough surface structure, and thus not only can prevent light from being diffusely reflected in exposure, but also causes no processing residue in a roughening treatment to be generated. Furthermore, chemical etching imparts more excellent light permeability, solvent resistance and wettability to the support film than any other roughening treatment described above, and thus enables a photocured film (cured film) to be formed without any loss in insulation reliability. As described below, a photosensitive resin layer is provided on the first main surface having the irregular surface formed by chemical etching, of the support film, to thereby allow a photocured film (cured film) having an irregular surface section to be formed depending on the shape of the irregular surface of the first main surface. Accordingly, the photosensitive dry film of the present disclosure can allow a photocured film (cured film) being excellent in resolution and insulation reliability and having a frosted appearance to be obtained.

The arithmetic average surface roughness Sa of the irregular surface of the first main surface is not particularly limited, and the lower limit value is preferably 0.10 μm, more preferably 0.20 μm, from the viewpoint of allowing a frosted appearance of a photocured film to be certainly obtained, and is particularly preferably 0.30 μm from the viewpoint of enhancing a frosted appearance, and resolution and insulation reliability in a well-balanced manner. The upper limit value of the arithmetic average surface roughness Sa of the irregular surface of the first main surface is preferably 1.00 μm, more preferably 0.90 μm, further preferably 0.80 μm, from the viewpoint of more certainly imparting resolution and insulation reliability to a photocured film, and is particularly preferably 0.70 μm the viewpoint of enhancing a frosted appearance, and resolution and insulation reliability in a well-balanced manner.

The second main surface of the support film is not subjected to any roughening treatment. Accordingly, no chemical etching and no irregular surface are respectively applied onto and formed on the second main surface. From the foregoing, the second main surface of the support film is a smooth surface form lower in arithmetic average surface roughness Sa than the first main surface, and is thus a smooth surface.

It is possible to obtain the second main surface not subjected to chemical etching with the first main surface being roughened, by exposing the second main surface covered with a masking film and the first main surface not covered with any masking film, to a polishing liquid as an acid solution or an alkali solution, in immersion of the support film in the polishing liquid for a predetermined time.

The thickness of the support film can be appropriately selected depending on, for example, usage conditions of the photosensitive dry film, and is, for example, 10 μm or more and 100 μm or less. The material of the support film is not particularly limited as long as it can allow the irregular surface to be formed and allow light in exposure to penetrate, and examples can include thermoplastic resins, for example, films of polyesters such as polyethylene terephthalate and polyethylene naphthalate; a polyimide film; a polyamide imide film; a polypropylene film, and a polystyrene film.

[Photosensitive Resin Layer]

The photosensitive resin layer is a coating film formed by coating the first main surface of the support film with a photosensitive resin composition. The photosensitive resin layer may be formed in a state of being directly contacted with the first main surface, or an intermediate layer such as a surface treatment layer may be interposed between the photosensitive resin layer and the first main surface. The photosensitive resin composition contains, for example, a photosensitive resin (A), an epoxy compound (B), an aliphatic-based urea compound (C), a reactive diluent (D), and a photopolymerization initiator (E).

(A) Photosensitive Resin

Examples of the photosensitive resin can include a carboxyl group-containing photosensitive resin having a free carboxyl group in a side chain. The chemical structure of the carboxyl group-containing photosensitive resin is not particularly limited, and examples include a carboxyl group-containing resin having one or more, preferably two or more photosensitive unsaturated double bonds in one molecule. Examples of the carboxyl group-containing photosensitive resin can include an epoxy resin with a radical polymerizable unsaturated monocarboxylate, modified by polybasic acid, such as polybasic acid-modified epoxy (meth)acrylate, obtained by reacting a radical polymerizable unsaturated monocarboxylic acid such as acrylic acid or methacrylic acid (hereinafter, sometimes referred to as "(meth)acrylic acid") with at least some of epoxy groups of a polyfunctional epoxy resin having two or more epoxy groups in one molecule, to obtain an epoxy resin with a radical polymerizable unsaturated monocarboxylate, such as epoxy (meth)acrylate, and reacting a polybasic acid and/or a polybasic acid anhydride with a hydroxyl group generated in the resin.

The type of the polyfunctional epoxy resin is not particularly limited as long as the resin is a di- or higher functional epoxy resin. The epoxy equivalent of the polyfunctional epoxy resin is not particularly limited, and, for example, the upper limit value is preferably 3000 g/eq, more preferably 2000 g/eq, particularly preferably 1500 g/eq. In this regard, the lower limit value of the epoxy equivalent of the polyfunctional epoxy resin is, for example, preferably 100 g/eq, particularly preferably 200 g/eq.

Examples of the polyfunctional epoxy resin can include a bisphenol A-type epoxy resin, a bisphenol F-type epoxy resin, a biphenylaralkyl-type epoxy resin, a phenylaralkyl-type epoxy resin, a biphenyl-type epoxy resin, a naphthalene-type epoxy resin, a dicyclopentadiene-type epoxy resin, an ε-caprolactone-modified epoxy resin, a phenol novolac-type epoxy resin, a cresol novolac-type epoxy resin, a bisphenol-modified novolac-type epoxy resin, a cyclic aliphatic epoxy resin, a glycidyl ester-type epoxy resin, a glycidylamine-type epoxy resin, and a heterocyclic epoxy resin. Such polyfunctional epoxy resins may be used singly or in combinations of two or more thereof.

The radical polymerizable unsaturated monocarboxylic acid is not particularly limited, and examples can include (meth)acrylic acid, crotonic acid, cinnamic acid, tiglic acid, and angelic acid. In particular, (meth)acrylic acid is preferable from the viewpoint of availability. Such radical polymerizable unsaturated monocarboxylic acids may be used singly or in combinations of two or more thereof. The radical polymerizable unsaturated monocarboxylic acid reacts with an epoxy group of the polyfunctional epoxy resin, and thus a photosensitive unsaturated double bond is introduced into a side chain of the resin and photosensitivity is imparted to the resin.

The reaction method of the polyfunctional epoxy resin and the radical polymerizable unsaturated monocarboxylic acid is not particularly limited, and examples include heating of the polyfunctional epoxy resin and the radical polymerizable unsaturated monocarboxylic acid in an appropriate non-reactive diluent (for example, organic solvent).

A hydroxyl group generated by ring-opening of an epoxy group due to the reaction of the polyfunctional epoxy resin and the radical polymerizable unsaturated monocarboxylic acid reacts with a polybasic acid and/or a polybasic acid anhydride, and thus a free carboxyl group is further introduced into a resin into which a photosensitive unsaturated double bond is introduced. A free carboxyl group is further introduced into a resin into which a photosensitive unsaturated double bond is introduced, to thereby impart alkali developability to the resin. The polybasic acid and the polybasic acid anhydride are not particularly limited, and any saturated or unsaturated one can be used. Examples of the polybasic acid include succinic acid, maleic acid, adipic acid, citric acid, phthalic acid, phthalic acid derivatives (for example, tetrahydrophthalic acid, 3-methyttetrahydrophthalic acid, 4-methyltetrahydrophthalic acid, 3-ethyltetrahydrophthalic acid, 4-ethyltetrahydrophthalic acid, hexahydrophthalic acid, 3-methylhexahydrophthalic acid, 4-methylhexahydrophthalic acid, 3-ethylhexahydrophthalic acid, 4-ethylhexahydrophthalic acid, methyltetrahydrophthalic acid, methylhexahydrophthalic acid, endo methylene tetrahydrophthalic acid, and methyl endo methylene tetrahydrophthalic acid), trimellitic acid, pyromellitic acid, and diglycol acid. Examples of the polybasic acid anhydride include respective anhydrides of polybasic acids described above. Such compounds may be used singly or in combinations of two or more thereof.

The reaction method of the epoxy resin with a radical polymerizable unsaturated monocarboxylate and the polybasic acid and/or polybasic acid anhydride is not particularly limited, and examples include heating of the epoxy resin with a radical polymerizable unsaturated monocarboxylate and the polybasic acid and/or polybasic acid anhydride in an appropriate non-reactive diluent (for example, organic solvent).

The epoxy resin with a radical polymerizable unsaturated monocarboxylate, modified by polybasic acid, can also be used as a photosensitive resin, and may be, if necessary, a carboxyl group-containing photosensitive resin more enhanced in photosensitivity by further reacting partially a carboxyl group of the epoxy resin with a radical polymerizable unsaturated monocarboxylate, modified by polybasic acid, with a compound (for example, glycidyl compound) having one or more radical polymerizable unsaturated groups and an epoxy group, to further introduce a radical polymerizable unsaturated group into a side chain of the resin.

The carboxyl group-containing photosensitive resin more enhanced in photosensitivity is more enhanced in photopolymerization reactivity, namely, photocuring ability and exerts more excellent photosensitivity because the glycidyl compound is added to a free carboxyl group to thereby bind a radical polymerizable unsaturated group to a side chain of a backbone of the epoxy resin with a radical polymerizable unsaturated monocarboxylate, modified by polybasic acid. Examples of the glycidyl compound include glycidyl acrylate, glycidyl methacrylate, allyl glycidyl ether, pentaerythritol triacrylate monoglycidyl ether, and pentaerythritol trimethacrylate monoglycidyl ether. The compound having one or more radical polymerizable unsaturated groups and an epoxy group may be used singly or in combinations of two or more thereof.

The acid value of the carboxyl group-containing photosensitive resin is not particularly limited, and the lower limit value is preferably 30 mgKOH/g, particularly preferably 40 mgKOH/g from the viewpoint of allowing alkali developability to be certainly obtained. In this regard, the upper limit value of the acid value of the carboxyl group-containing photosensitive resin is preferably 200 mgKOH/g from the viewpoint of certainly preventing an exposed section (photocured section) from being dissolved by an alkali developer, and is particularly preferably 150 mgKOH/g from the viewpoint of improving a moisture resistance of a photocured product.

The weight average molecular weight (Mw) of the photosensitive resin is not particularly limited, and the lower limit value is preferably 6000, more preferably 7000, particularly preferably 8000 from the viewpoints of toughness and finger touch dryness of a photocured product. In this regard, the upper limit value of the weight average molecular weight (Mw) of the photosensitive resin is particularly preferably 200000, more preferably 100000, particularly preferably 50000 from the viewpoint of certainly preventing deterioration in alkali developability.

The photosensitive resin may be synthesized by the above reaction using the above respective starting materials, or a commercially available photosensitive resin may be used. Examples of such a commercially available photosensitive resin can include carboxyl group-containing photosensitive resins such as "SP-4621" (Showa Denko K.K.), "KAYARAD ZAR-2000", "KAYARAD ZFR-1122", "KAYARAD FLX-2089" and "KAYARAD ZCR-1569H" (all are from Nippon Kayaku Co., Ltd.), and "Cydomer P(ACA)Z-250" (Daicel Corporation). Such photosensitive resins may be used singly or in combinations of two or more thereof.

(B) Epoxy Compound

The epoxy compound is for obtaining a photocured product having sufficient strength due to an increase in cross-linking density of a photocured product. Examples of the epoxy compound include an epoxy resin. The epoxy resin is not particularly limited in terms of the chemical structure, and examples can include a bisphenol A-type epoxy resin, a bisphenol F-type epoxy resin, a biphenylaralkyl-type epoxy resin, a phenylaralkyl-type epoxy resin, a biphenyl-type epoxy resin, a naphthalene-type epoxy resin, a dicydopentadiene-type epoxy resin, an ε-caprolactone-modified epoxy resin, a phenol novolac-type epoxy resin, a cresol novolac-type epoxy resin, a bisphenol-modified novolac-type epoxy resin, a cyclic aliphatic epoxy resin (alicyclic epoxy resin), a glycidyl ester-type epoxy resin, a glycidylamine-type epoxy resin, a heterocyclic epoxy resin, a triazine-type epoxy resin, a hydroquinone-type epoxy resin, and a tetrakisphenolethane-type epoxy resin. Such epoxy compounds may be used singly or in combinations of two or more thereof. Among such epoxy compounds, a bisphenol A-type epoxy resin, a biphenyl-type epoxy resin, and an alicyclic epoxy resin are preferable from the viewpoint of being capable of making a contribution to more certainly obtaining a photocured film being excellent in insulation reliability and resolution and having a frosted appearance.

The content of the epoxy compound is not particularly limited, and is preferably 10 parts by mass or more and 100 parts by mass or less, particularly preferably 20 parts by mass or more and 70 parts by mass or less based on 100 parts by mass of the photosensitive resin.

(C) Aliphatic-Based Urea Compound

The aliphatic-based urea compound can not only contribute to enhancements in resolution and insulation reliability of a photocured product, but also contribute to formation of a frosted appearance of a photocured product. The aliphatic-based urea compound is an aliphatic urea compound having no aromatic ring in the chemical structure of the compound.

The melting point of the aliphatic-based urea compound is not particularly limited, and is preferably 100° C. or more and 250° C. or less, preferably 120° C. or more and 230° C. or less, particularly preferably 140° C. or more and 210° C. or less from the viewpoint of certainly contributing to a frosted appearance, insulation reliability and resolution.

The aliphatic-based urea compound is, for example, an aliphatic-based urea compound having a cyclic aliphatic structure. The aliphatic-based urea compound having a cyclic aliphatic structure can be, for example, a compound represented by the following general formula (1).

[Formula 1]

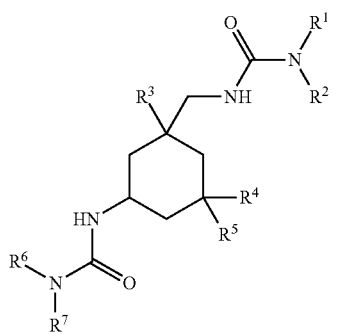

(1)

In the formula, $R^1$, $R^2$, $R^3$, $R^4$, $R^5$, $R^6$, and $R^7$ each independently represent a saturated aliphatic hydrocarbon group having 1 to 20 carbon atoms or an unsaturated aliphatic hydrocarbon group having at least one ethylenically unsaturated group and having 2 to 20 carbon atoms.

In particular, an aliphatic-based urea compound of general formula (1) where $R^1$, $R^2$, $R^3$, $R^4$, $R^5$, $R^6$, and $R^7$ each independently represent a saturated aliphatic hydrocarbon group having 1 to 5 carbon atoms is more preferable, an aliphatic-based urea compound of general formula (1) where $R^1$, $R^2$, $R^3$, $R^4$, $R^5$, $R^6$, and $R^7$ each independently represent a saturated aliphatic hydrocarbon group having 1 to 3 carbon atoms is further preferable, and an aliphatic-based urea compound of general formula (1) where $R^1$, $R^2$, $R^3$, $R^4$, $R^5$, $R^6$, and $R^7$ each represent a methyl group is particularly preferable, from the viewpoint of reducing gloss value of a photocured product to certainly contribute to formation of a frosted appearance. The aliphatic-based urea compound of general formula (1) where $R^1$, $R^2$, $R^3$, $R^1$, $R^5$, $R^6$, and $R^7$ each represent a methyl group is N'-[3-[[[(dimethylamino)carbonyl]amino]methyl]-3,5,5-trimethylcyclohexyl]-N,N-dimethylurea. The melting point of N'-[3-[[[(dimethyl-amino)carbonyl]amino]methyl]-3,5,5-trimethylcycohexyl]-N,N-dimethylurea is about 150° C.

The content of the aliphatic-based urea compound is not particularly limited, and the lower limit value is preferably 1.0 part by mass, more preferably 2.0 parts by mass, particularly preferably 3.0 parts by mass based on 100 parts by mass of the photosensitive resin, from the viewpoint of sure contribution to formation of a frosted appearance. In this regard, the content of the upper limit value of the aliphatic-based urea compound is preferably 20 parts by mass, more preferably 15 parts by mass, particularly preferably 10 parts by mass based on 100 parts by mass of the photosensitive resin, from the viewpoint of insulation reliability.

(D) Reactive Diluent

The reactive diluent is, for example, a photopolymerizable monomer, and is a compound having preferably at least one polymerizable double bond in one molecule, preferably two or more polymerizable double bonds in one molecule. The reactive diluent allows the photosensitive resin composition to be sufficiently photocured, and contributes to acid resistance, heat resistance, alkali resistance, and the like of a photocured product. Examples of the reactive diluent can include a (meth)acrylate monomer, and can specifically include a monofunctional (meth)acrylate monomer, a difunctional (meth)acrylate monomer, and a tri- or higher functional (meth)acrylate monomer. Specific examples include monofunctional (meth)acrylates such as 2-hydroxyethyl (meth)acrylate, phenoxyethyl (meth)acrylate, diethylene glycol mono(meth)acrylate, 2-hydroxy-3-phenoxypropyl (meth)acrylate and caprolactone-modified (meth)acrylate, difunctional (meth)acrylates such as 1,4-butanediol di(meth)acrylate, 1,6-hexanediol di(meth)acrylate, neopentyl glycol di(meth)acrylate, diethylene glycol di(meth)acrylate, neopentyl glycol adipate di(meth)acrylate, hydroxypivalate neopentyl glycol di(meth)acrylate, dicyclopentanyl di(meth)acrylate, ethylene oxide-modified phosphoric acid di(meth)acrylate, allylated cyclohexyl di(meth)acrylate and isocyanurate di(meth)acrylate, tri- or higher functional (meth)acrylates such as trimethylolpropane tri(meth)acrylate, ditrimethylolpropane tetra(meth)acrylate, dipentaerythritol tri(meth)acrylate, pentaerythritol tri(meth)acrylate, propylene oxide-modified trimethylolpropane tri(meth)acrylate, tris(acryloxyethyl) isocyanurate, propionic acid-modified dipentaerythritol penta(meth)acrylate and dipentaerythritol hexa(meth)acrylate, and urethane (meth)acrylate. Urethane (meth)acrylate can be compounded to thereby impart also flexibility to a photocured product. Such reactive diluents may be used singly or in combinations of two or more thereof.

The content of the reactive diluent is not particularly limited, and is preferably 5.0 parts by mass or more and 50 parts by mass or less, particularly preferably 10 parts by mass or more and 30 parts by mass or less based on 100 parts by mass of the photosensitive resin.

(E) Photopolymerization Initiator

The photopolymerization initiator is not particularly limited, and examples include 1,2-octanedione, oxime ester-based photopolymerization initiators such as 1-[4-(phenylthio)-2-(O-benzoyloxime)], ethanone 1-[9-ethyl-6-(2-methylbenzoyl)-9H-carbazol-3-yl]-1-(0-acetyloxime), 2-(acetyloxyiminomethyl)thioxanthen-9-one, 1,8-octanedione, 1,8-bis[9-ethyl-6-nitro-9H-carbazol-3-yl]-,1,8-bis(O-acetyloxime), 1,8-octanedione, 1,8-bis[9-(2-ethylhexyl)-6-nitro-9H-carbazol-3-yl]-,1,8-bis(O-acetyloxime) and (Z)-(9-ethyl-6-nitro-9H-carbazol-3-yl)(4-((1-methoxypropan-2-yl)oxy)-2-methylphenyl)methanone O-acetyloxime, and α-aminoalkylphenone-based photopolymerization initiators such as 2-benzyl-2-dimethylamino-1-morpholinophenone)-butanone-1,2-(dimethylamino)-2-[(4-methylphenyl)methyl]-1-[4-(4-morpholinyl)phenyl]-1-butanone, 2-methyl-1-[4-(methylthio)phenyl]-2-morpholino-propanone-1 and 1-benzyl-1-(dimethylamino)propyl-4-morpholinophenyl-ketone.

Any photopolymerization initiator other than such oxime ester-based photopolymerization initiators and α-aminoalkylphenone-based photopolymerization initiators may be used as the photopolymerization initiator. Examples of such any other photopolymerization initiator include benzoin-based photopolymerization initiators such as benzoin, benzoin methyl ether, benzoin ethyl ether, benzoin isopropyl ether, benzoin-n-butyl ether and benzoin isobutyl ether; acetophenone-based photopolymerization initiators such as acetophenone, dimethylaminoacetophenone, 2,2-dimethoxy-2-phenylacetophenone and 2,2-diethoxy-2-phenylacetophenone; benzophenone-based photopolymerization initiators such as benzophenone, p-phenylbenzophenone, 4,4'-diethylaminobenzophenone and dichlorobenzophenone; anthraquinone-based photopolymerization initiators such as 2-methylanthraquinone, 2-ethylanthraquinone, 2-tert-butylanthraquinone and 2-aminoanthraquinone; thioxanthone-based photopolymerization initiators such as 2-methylthioxanthone, 2-ethylthioxanthone, 2-chlorothioxanthone, 2,4-dimethylthioxanthone and 2,4-diethylthioxanthone; and benzoate-based photopolymerization initiators such as ethyl-4-(dimethylamino)benzoate, 2-n-butoxyethyl-4-(dimethylamino)benzoate, methyl-4-(dimethylamino)benzoate, isoamyl-4-(dimethylamino)benzoate, 2-(dimethylamino)ethylbenzoate and 2-ethylhexyl-4-(dimethylamino)benzoate. Such photopolymerization initiators may be used singly or in combinations of two or more thereof. Among such photopolymerization initiators, such oxime ester-based photopolymerization initiator and α-aminoalkylphenone-based photopolymerization initiator are preferable from the viewpoint of being excellent in photosensitivity.

The content of the photopolymerization initiator is not particularly limited, and is preferably 1.0 part by mass or more and 10 parts by mass or less, particularly preferably 2.0 parts by mass or more and 8.0 parts by mass or less based on 100 parts by mass of the photosensitive resin.

Any component other than the components (A) to (E), for example, an extender pigment, a flame retardant, a curing accelerator, an additive, a colorant, and/or a non-reactive diluent can be, if necessary, further compounded in the photosensitive resin composition.

Examples of the extender pigment include aluminum hydroxide, aluminum oxide and barium sulfate. Examples of the curing accelerator include mercaptobenzoxazale and derivatives of this accelerator, dicyandiamide (DICY) and derivatives of this accelerator, melamine and derivatives of this accelerator, a boron trifluoride-amine complex, organic acid hydrazide, diaminomaleonitrile (DAMN) and derivatives of this accelerator, guanamine and derivatives of this accelerator, amineimide (AI), and polyamine. Examples of the additive include silicone-based, hydrocarbon-based and acrylic defoamers, dispersants such as a (meth)acrylic polymer, a thixotropy-imparting agent, an antioxidant, and a filler.

The colorant is, for example, a pigment or a dye and is not particularly limited, and any colorant such as a white colorant, a blue colorant, a green colorant, a yellow colorant, a purple colorant, a black colorant, an orange colorant or a red colorant can be used depending on the desired color. Examples of the colorant can include titanium dioxides (rutile-type titanium oxide and anatase-type titanium oxide) being white colorants, inorganic colorants such as acetylene black and carbon black being black colorants, phthalocyanine colorants such as Phthalocyanine Green being a green colorant and Phthalocyanine Blue and Lionol Blue being blue colorants, and organic colorants such as a diketo pyrrolo pyrrole-based colorant, for example, Chlomophthal Orange being an orange colorant.

The flame retardant is for imparting flame retardance to a photocured product of the photosensitive resin layer. Examples of the flame retardant can include a phosphorus-based flame retardant. Examples of the phosphorus-based flame retardant include halogen-containing phosphates such as tris(chloroethyl)phosphate, tris(2,3-dichloropropyl)phosphate, tris(2-chloropropyl)phosphate, tris(2,3-bromopropyl) phosphate, tris(bromochloropropyl)phosphate, 2,3-dibromopropyl-2,3-chloropropyl phosphate, tris(tribromophenyl) phosphate, tris(dibromophenyl)phosphate and tris (tribromoneopentyl)phosphate; non-halogen-based aliphatic phosphates such as trimethyl phosphate, triethyl phosphate, tributyl phosphate, trioctyl phosphate and tributoxyethyl phosphate; non-halogen-based aromatic phosphates such as triphenyl phosphate, cresyl diphenyl phosphate, dicresyl phenyl phosphate, tricresyl phosphate, trixylenyl phosphate, xylenyl diphenyl phosphate, tris(isopropylphenyl)phosphate, isopropylphenyl diphenyl phosphate, diisopropylphenyl phenyl phosphate, tris(trimethylphenyl)phosphate, tris (t-butylphenyl)phosphate, hydroxyphenyl diphenyl phosphate and octyl diphenyl phosphate; phosphinic acid metal salts such as aluminum trisdiethylphosphinate, aluminum trismethylethylphosphinate, aluminum trisdiphenylphosphinate, zinc bisdiethylphosphinate, zinc bismethylethylphosphinate, zinc bisdiphenylphosphinate, titanyl bisdiethylphosphinate, titanium tetrakisdiethylphosphinate, titanyl bismethylethylphosphinate, titanium tetrakismethylethylphosphinate, titanyl bisdiphenylphosphinate and titanium tetrakisdiphenylphosphinate, and phosphine oxide-based compounds such as 9,10-dihydro-9-oxa-10-phosphaphenanthrene-10-oxide, diphenyl vinyl phosphine oxide, triphenylphosphine oxide, trialkyl phosphine oxide and tris(hydroxyalkyl)phosphine oxide. In particular, an organic phosphate-based flame retardant is preferable. Such flame retardants may be used singly or in combinations of two or more thereof.

The non-reactive diluent is a component for modulating the viscosity and dryness of the photosensitive resin layer, and the viscosity and coatability of the photosensitive resin composition. Examples of the non-reactive diluent can include an organic solvent. Examples of the organic solvent can include ketones such as methyl ethyl ketone, aromatic hydrocarbons such as benzene, toluene and xylene, alcohols such as methanol, ethanol, n-propanol, isopropanol and cyclohexanol, alicyclic hydrocarbons such as cyclohexane and methylcyclohexane, petroleum-based solvents such as petroleum ether and petroleum naphtha, cellosolves such as cellosolve and butyl cellosolve, carbitols such as carbitol and butyl carbitol, and esters such as ethyl acetate, butyl acetate, cellosolve acetate, butyl cellosolve acetate, carbitol acetate, butyl carbitol acetate, ethylene glycol acetate and ethyl diglycol acetate. Such solvents may be used singly or in combinations of two or more thereof.

The method for producing the photosensitive resin composition is not limited to a particular method, and the photosensitive resin composition can be produced by, for example, compounding the respective components at predetermined proportions, and thereafter kneading or mixing the components at room temperature (for example, 10° C. to 30° C.) by a kneading unit such as a triple roll, a ball mill, a sand mill, a bead mill or a kneader, or a stirring or mixing unit such as a super mixer, a planetary mixer or a trimix. Preliminary kneading or preliminary mixing may also be, if necessary, performed before the kneading or mixing.

The thickness of the photosensitive resin layer can be appropriately selected depending on, for example, usage conditions of the photosensitive dry film, and is, for example, 10 μm or more and 100 μm or less.

<Method for Producing Photosensitive Dry Film>

Thereafter, an example of the method for producing the photosensitive dry film of the present disclosure is described. The photosensitive dry film of the present disclosure has a stacked structure having a support film, a photosensitive resin layer with which the support film is coated, and a covering film (for example, a resin film such as a polyethylene film or a polypropylene film) protecting the photosensitive resin layer. First, a first main surface of the support film is coated with the photosensitive resin composition by a known method such as a roller coating method or a bar coating method, to form a coating film of the photosensitive resin composition, having a predetermined thickness. The coating film formed of the photosensitive resin composition is subjected to a drying treatment, to thereby form the photosensitive resin layer on the first main surface of the support film. Thereafter, the covering film is stacked on the photosensitive resin layer formed, and thus it is possible to produce a photosensitive dry film having the photosensitive resin layer.

<Method for Using Photosensitive Dry Film>

Thereafter, an example of the method for using the photosensitive dry film of the present disclosure is described. An example here described is a method involving using the photosensitive dry film of the present disclosure to form a solder resist film being an insulating protective film, on a printed wiring board having a circuit pattern formed by etching copper foil. In other words, a method for producing a printed wiring board having an insulating protective film, by using the photosensitive dry film of the present disclosure, for formation of a solder resist film, is described.

A method for producing a printed wiring board having an insulating protective film includes a step of bonding the photosensitive resin layer of the photosensitive dry film to a printed wiring board, a step of applying ultraviolet light from above the support film of the photosensitive dry film, to photocure the photosensitive resin layer, a step of releasing the support film from the photosensitive dry film and developing the photosensitive resin layer photocured, to form a photocured film having a predetermined pattern, and a step of subjecting the photocured film having a predetermined pattern to a thermal curing treatment, to form a cured film having an irregular surface section.

Specifically, first, the photosensitive dry film produced as described above is subjected to bonding of the photosensitive resin layer (solder resist layer) and a printed wiring board with releasing a covering film, and thus the photosensitive resin layer (solder resist layer) is formed on the printed wiring board. Examples of lamination conditions for bonding the photosensitive resin layer (solder resist layer) of the photosensitive dry film and the printed wiring board include conditions of pressurizing at a temperature of 40 to 60° C. and a pressure of 0.3 to 0.7 MPa for 10 to 60 seconds under vacuum. The support film remains to be stacked on the photosensitive resin layer (solder resist layer) at this stage. Thereafter, preliminary drying with heating at a temperature of about 100 to 120'C for about 1 to 10 minutes is, if necessary, conducted in order to sublimate the non-reactive diluent in the photosensitive resin layer, to volatilize the non-reactive diluent from the photosensitive resin layer, allowing a surface of the photosensitive resin layer (solder resist layer) to be in a tack-free state. Thereafter, a negative film having a pattern made translucent except for any other than the land of a circuit pattern is placed on the support film, and the photosensitive resin layer (solder resist layer) is photocured by irradiation with ultraviolet light (for example, in a wavelength range from 300 to 400 nm) from above the negative film. Thereafter, the support film is released and a non-exposed region corresponding to the land is removed by an aqueous dilute alkali solution, to thereby develop the photosensitive resin layer (solder resist layer), to form a photocured film having a predetermined pattern. A spray method, a shower method or the like is used for the development method, and examples of the aqueous dilute alkali solution used include an aqueous solution of 0.5 to 5% by mass sodium carbonate. After such alkali development, the photosensitive resin layer (solder resist layer) is subjected to a thermal curing treatment by, for example, a hot air circulation-type drier at 130 to 170° C. for 20 to 80 minutes to thereby allow the printed wiring board to have an irregular surface section, and thus it is possible to form a solder resist film having a frosted appearance imparted.

The photosensitive resin layer is provided on the first main surface having an irregular surface formed by chemical etching, of the support film, in the photosensitive dry film of the present disclosure, and thus a cured film having an irregular surface section is formed depending on the form of the irregular surface of the first main surface. From the foregoing, the cured film has an irregular surface section onto which the form of the irregular surface of the first main surface is transferred. Accordingly, for example, in a case where the arithmetic average surface roughness Sa of the irregular surface of the first main surface is in a range of 0.10 μm or more and 1.00 μm or less, the arithmetic average surface roughness Sa of the irregular surface section of the cured film is in a range of 0.10 μm or more and 1.00 μm or less, and in a case where the arithmetic average surface roughness Sa of the irregular surface of the first main surface is 0.50 μm, the arithmetic average surface roughness Sa of the irregular surface section of the cured film is 0.50 μm.

The photosensitive dry film of the present disclosure enables a photocured product having a frosted appearance, namely, having a matted appearance to be obtained, as described above. For example, the gloss value is preferably 50% or less, as obtained by measuring the 60-degree mirror reflectivity of a surface of a photocured product with a glossmeter, the photocured product being obtained by bonding the photosensitive resin layer of the photosensitive dry film of the present disclosure onto a substrate and thereafter subjecting the bonded product to drying at 110° C. for 5 minutes, irradiation with ultraviolet light at 150 mJ/cm$^2$ and thermal curing at 150° C. for 60 minutes. The gloss value is reduced to 50% or less, to thereby allow for a photocured product having a frosted appearance and also having obliterating power. The gloss value is more preferably lower, and the gloss value is, for example, more preferably 40% or less, particularly preferably 30% or less.

EXAMPLES

Thereafter, Examples of the present disclosure are described, but the present disclosure is not intended to be limited to these Examples without departing from the gist of the present disclosure.

Examples 1 to 7 and Comparative Examples 1 to 6

Respective components shown in Tables 1 and 2 below were compounded at compounding proportions shown in Tables 1 and 2 below, and mixed and dispersed using a triple roll at room temperature (about 25° C.), to prepare respective photosensitive resin compositions for use in photosensitive resin layers of photosensitive dry films of Examples 1 to 7 and Comparative Examples 1 to 6. The amounts of the respective components compounded, shown in Tables 1 and 2 below, are represented by "part(s) by mass", unless particularly noted. Any blank column with respect to the amount compounded, in Tables 1 and 2 below, means no compounding.

The details of the respective components in Tables 1 and 2 below are as follows.

(A) Photosensitive Resin

KAYARAD ZCR-1569H: solid content (resin content) 65% by mass, Nippon Kayaku Co., Ltd.

KAYARAD ZCR-1569H is a carboxyl group-containing photosensitive resin, and is a polybasic acid-modified epoxy acrylate resin having a chemical structure prepared by reacting at least some of epoxy groups of an epoxy resin (biphenylaralkyl-type epoxy resin) with an acrylic acid, to thereby obtain epoxy acrylate, and reacting a polybasic acid with a hydroxyl group of such epoxy acrylate.

(B) Epoxy Compound

EPICLON 850-S: liquid epoxy compound, DIC Corporation

YX-4000: crystalline epoxy compound having a melting point of less than 130° C., here having a melting point of about 105° C., Mitsubishi Chemical Corporation Celloxide 2021P: Daicel Corporation (C) Aliphatic-Based Urea Compound U-Cat3513N: N'-[3-[[[(dimethylamino)carbonyl]amino] methyl]-3,5,5-trimethylcyclohexyl]-N,N-dimethylurea having a melting point of about 150° C. to 200° C., San-Apro Ltd.

(D) Reactive Diluent

EBECRYL8405: Dalcel-Cytec Co., Ltd.

(E) Photopolymerization Initiator

OXE-02: ethanone 1-[9-ethyl-6-(2-methylbenzoyl)-9H-carbazol-3-yl]-1-(0-acetyloxime), BASF SE Irgacure 369: 1-benzyl-1-(dimethylamino)propyl-4-morpholinophenyl-ketone, BASF SE Extender Pigment Higilite H42M: Showa Denko K.K.

Flame Retardant

Exolit OP-935: Clariant Japan K.K.

Curing accelerator

Melamine: Nissan Chemical Corporation

DICY-7: Mitsubishi Chemical Corporation

Additive

AC-303: dispersant, Kyoeisha Chemical Co., Ltd.

Colorant

Denka Black: Denka Company Limited

Non-Reactive Diluent

EDGAC: Sanyo Kaseihin K.K.

Step of Producing Photosensitive Dry Film

Support Film for Photosensitive Dry Film

Support film of each of Examples 1 to 7: a masking film made of a polypropylene film was bonded to one surface (second main surface) of a polyethylene terephthalate (PET) film "R310" having a thickness of 25 μm (arithmetic average surface roughness Sa:0.03 μm) from Mitsubishi Plastics, Inc., thereafter the bonded product was immersed (chemically etched) in an aqueous 38% by mass potassium hydroxide solution (95° C.) and washed with water, and thereafter the masking film was released and the remaining object was dried, to thereby obtain a film chemically etched, having a predetermined arithmetic average surface roughness Sa, on other surface (first main surface). The film chemically etched was used as each support film of Examples 1 to 7. The arithmetic average surface roughness Sa of the first main surface of the film chemically etched was adjusted by the immersion time in the aqueous potassium hydroxide solution.

Support film of Comparative Example 1: Emblet CM-25 from Unitika Ltd., a coating matte film having a thickness of 25 μm (arithmetic average surface roughness Sa: 0.6 μm)

Support film of Comparative Example 2: Emblet SM-25 from Unitika Ltd., a sand matte film having a surface subjected to a sand blast treatment and having a thickness of 25 μm (arithmetic average surface roughness Sa: 0.6 μm)

Support film of Comparative Example 3: Emblet PTH-25 from Unitika Ltd., a kneaded matte film having a thickness of 25 μm (matte film with both surfaces kneaded, arithmetic average surface roughness Sa of first main surface and second main surface: 0.3 μm)

Support film of Comparative Example 4: R310 from Mitsubishi Plastics, Inc., a polyethylene terephthalate (PET) film having a thickness of 25 μm (not matted, arithmetic average surface roughness Sa: 0.03 μm)

Support film of Comparative Example 5: a film chemically etched of R310 was used as the support film, the film chemically etched being a film with both surfaces chemically etched in the similar manner as in Examples except that no masking film was bonded on a second main surface and both a first main surface and the second main surface were chemically etched (both the first main surface and the second main surface each having the arithmetic average surface roughness Sa of 0.4 μm).

Support film of Comparative Example 6: a matte film kneaded having a thickness of 25 μm (arithmetic average surface roughness Sa of first main surface: 0.3 μm; arithmetic average surface roughness Sa of second main surface: 0.03 μm) from Unitika Ltd.

Coating of support film with photosensitive resin composition: one surface (first main surface) of the support film was coated with the photosensitive resin composition by a bar coating method so that the thickness of the photosensitive resin layer after preliminary drying was 30 μm.

Preliminary drying: 110° C., 5 minutes

A photosensitive dry film was produced in the above step.

Step of Producing Test Sample

Substrate evaluated: two-layer copper-clad laminate (pitch between conductors: 25 μm; conductor thickness: 12.5 μm)

Surface treatment of substrate evaluated: surface treatment with 5% by mass sulfuric acid Conditions of lamination of photosensitive dry film on substrate evaluated: 50° C., pressurizing at 0.5 MPa, vacuum for 30 s/pressurizing for 30 s Exposure treatment (photocuring treatment): exposure by irradiation of photosensitive resin layer with ultraviolet light (wavelength of 300 to 400 nm) at 150 mJ/cm$^2$ by projection exposure apparatus (light source: high-pressure mercury lamp from Ushio Inc.)

Development: development by aqueous 1% by mass sodium carbonate solution after releasing of support film. Development conditions: temperature 30° C., spray pressure 0.2 MPa, and development time 60 seconds Thermal curing treatment (post-cure): 150° C., 60 minutes Evaluation Items (1) Gloss Value (Frosted Appearance)

The 60-degree mirror reflectivity on a surface of the photosensitive resin layer was measured with a glossmeter VG-2000 (Nippon Denshoku Industries Co., Ltd.). It was evaluated that a frosted appearance was obtained at a gloss value of 50% or less.

(2) Arithmetic Average Surface Roughness Sa

The irregular surface of the support film and the irregular surface section of the cured film were subjected to measurement of the arithmetic average surface roughness Sa with a surface roughness meter (Model "shape analysis laser microscope VK-X1000" from Keyence Corporation) according to ISO 25178.

(3) Photo Via Resolution

The photosensitive resin layer was subjected to an exposure treatment with a predetermined photomask (via opening diameter ϕ200 μm) being interposed, and thereafter the diameter of a photo via opened by development was measured with a metal microscope.

(4) Insulation Reliability (Insulation Reliability in Thickness Direction (Z-Axis Direction) of Coating Film Cured)

A test sample produced in the step of producing a test sample was adopted, and an upper surface of a cured film with silver deposited on the cured film was connected to an anode and copper as a conductor of the substrate evaluated was connected to a cathode, respectively. Next, application at 50 V was performed in a constant temperature and humidity tank at 60° C. and at a humidity of 95%, to continuously measure the value of resistance with an ion migration tester ("MIG-8600B/128" from IMV Corporation). The time point of application at 50 V was defined as the measurement start time, the time until the value of resistance was reduced to less than $1.0E+6$ ($1.0\times10^6$) Ω was measured and defined as the dielectric breakdown time, and the insulation reliability in the thickness direction (Z-axis direction) was evaluated according to the following criteria.

Excellent: a dielectric breakdown time of 1500 hours or more.
Good: a dielectric breakdown time of 1000 hours or more and less than 1500.
Poor: a dielectric breakdown time of less than 1000 hours.

The evaluation results are shown in Tables 1 and 2 below.

TABLE 1

| | | | Example 1 Arithmetic average surface roughness Sa of film with one surface chemically etched: 0.3 μm | Example 2 Arithmetic average surface roughness Sa of film with one surface chemically etched: 0.4 μm | Example 3 Arithmetic average surface roughness Sa of film with one surface chemically etched: 0.5 μm | Example 4 Arithmetic average surface roughness Sa of film with one surface chemically etched: 0.6 μm | Example 5 Arithmetic average surface roughness Sa of film with one surface chemically etched: 0.7 μm | Example 6 Arithmetic average surface roughness Sa of film with one surface chemically etched: 0.8 μm | Example 7 Arithmetic average surface roughness Sa of film with one surface chemically etched: 0.5 μm |
|---|---|---|---|---|---|---|---|---|---|
| | Support film (thickness 25 μm) | | | | | | | | |
| | Components | Product name | Chemical name | | | | | | |
| Photosensitive resin layer | (A) Photosensitive resin | KAYARAD ZCR-1569H | Acid-modified biphenylaralkyl-type epoxy acrylate resin | 150 | 150 | 150 | 150 | 150 | 150 | 150 |
| | (B) Epoxy compound | EPICLON 850-S | Bisphenol A-type epoxy resin | 20 | 20 | 20 | 20 | 20 | 20 | |
| | | YX-4000 | Biphenyl-type epoxy resin | 30 | 30 | 30 | 30 | 30 | 30 | 30 |
| | | Celloxide 2021P | Alicyclic epoxy resin | | | | | | | 20 |
| | (C) Aliphatic-based urea compound | U-Cat3513N Melting point 150 to 200° C. | Aliphatic dimethylurea | 5 | 5 | 5 | 5 | 5 | 5 | 5 |
| | (D) Reactive diluent | EBECRYL8405 | Urethane acrylate | 20 | 20 | 20 | 20 | 20 | 20 | 20 |
| | Extender pigment | Higilite H42M | Aluminum hydroxide | 10 | 10 | 10 | 10 | 10 | 10 | 10 |
| | Flame retardant | Exolit OP-935 | Organic phosphate | 20 | 20 | 20 | 20 | 20 | 20 | 20 |
| | (E) Photopolymerization initiator | OXE-02 | Oxime ester compound | 1 | 1 | 1 | 1 | 1 | 1 | 1 |
| | | Irgacure369 | α-Aminoalkyl-phenone-based | 3 | 3 | 3 | 3 | 3 | 3 | 3 |
| | Curing accelerator | Melamine | Melamine | 3 | 3 | 3 | 3 | 3 | 3 | 3 |
| | | DICY-7 | Dicyandiamide | 0.2 | 0.2 | 0.2 | 0.2 | 0.2 | 0.2 | 0.2 |
| | Additive | AC-303 | Acrylic polymer | 2 | 2 | 2 | 2 | 2 | 2 | 2 |
| | Colorant | Denka Black | Acetylene black | 1 | 1 | 1 | 1 | 1 | 1 | 1 |
| | Non-reactive diluent | EDGAC | Ethyl diglycol acetate | 30 | 30 | 30 | 30 | 30 | 30 | 30 |
| | | Total | | 295.2 | 295.2 | 295.2 | 295.2 | 295.2 | 295.2 | 295.2 |
| | Evaluation results (thickness of SR: 20 μm) | Gloss value (%) | | 40 | 30 | 10 | 7 | 5 | 3 | 10 |
| | | Arithmetic average surface roughness Sa (μm) | | 0.3 | 0.4 | 0.5 | 0.6 | 0.7 | 0.8 | 0.5 |

TABLE 1-continued

| Components | | | Example 1 Arithmetic average surface roughness Sa of film with one surface chemically etched: 0.3 μm | Example 2 Arithmetic average surface roughness Sa of film with one surface chemically etched: 0.4 μm | Example 3 Arithmetic average surface roughness Sa of film with one surface chemically etched: 0.5 μm | Example 4 Arithmetic average surface roughness Sa of film with one surface chemically etched: 0.6 μm | Example 5 Arithmetic average surface roughness Sa of film with one surface chemically etched: 0.7 μm | Example 6 Arithmetic average surface roughness Sa of film with one surface chemically etched: 0.8 μm | Example 7 Arithmetic average surface roughness Sa of film with one surface chemically etched: 0.5 μm |
|---|---|---|---|---|---|---|---|---|---|
| Support film (thickness 25 μm) | Product name | Chemical name | | | | | | | |
| | Opening diameter (φ200 μm) | | φ181 μm | φ180 μm | φ176 μm | φ170 μm | φ168 μm | φ162 μm | φ178 μm |
| | Insulation reliability (60° C., 95% RH) | | Excellent | Excellent | Excellent | Excellent | Excellent | Good | Excellent |

TABLE 2

| | | | Comparative Example 1 Coating matte film | Comparative Example 2 Sand matte film | Comparative Example 3 Kneaded matte film | Comparative Example 4 PET film not matted | Comparative Example 5 Film with both surfaces chemically etched | Comparative Example 6 Matte film with one surface kneaded |
|---|---|---|---|---|---|---|---|---|
| | Support film (thickness 25 μm) | | | | | | | |
| | Components | Product name | Chemical name | | | | | |
| Photosensitive resin layer | (A) Photosensitive resin | KAYARAD ZCR-1569H | Acid-modified biphenylaralkyl-type epoxy acrylate resin | 150 | 150 | 150 | 150 | 150 | 150 |
| | (B) Epoxy compound | EPICLON 850-S | Bisphenol A-type epoxy resin | 20 | 20 | 20 | 20 | 20 | 20 |
| | | YX-4000 | Biphenyl-type epoxy resin | 30 | 30 | 30 | 30 | 30 | 30 |
| | (C) Aliphatic-based urea compound | U-Cat3513N Melting point 150 to 200° C. | Aliphatic dimethylurea | 5 | 5 | 5 | 5 | 5 | 5 |
| | (D) Reactive diluent | EBECRYL8405 | Urethane acrylate | 20 | 20 | 20 | 20 | 20 | 20 |
| | Extender pigment | Higilite H42M | Aluminum hydroxide | 10 | 10 | 10 | 10 | 10 | 10 |
| | Flame retardant | Exolit OP-935 | Organic phosphate | 20 | 20 | 20 | 20 | 20 | 20 |
| | (E) Photopolymerization initiator | OXE-02 | Oxime ester compound | 1 | 1 | 1 | 1 | 1 | 1 |
| | | Irgacure369 | α-Aminoalkyl-phenone-based | 3 | 3 | 3 | 3 | 3 | 3 |
| | Curing accelerator | Melamine | Melamine | 3 | 3 | 3 | 3 | 3 | 3 |
| | | DICY-7 | Dicyandiamide | 0.2 | 0.2 | 0.2 | 0.2 | 0.2 | 0.2 |
| | Additive | AC-303 | Acrylic polymer | 2 | 2 | 2 | 2 | 2 | 2 |
| | Colorant | Denka Black | Acetylene black | 1 | 1 | 1 | 1 | 1 | 1 |
| | Non-reactive diluent | EDGAC | Ethyl diglycol acetate | 30 | 30 | 30 | 30 | 30 | 30 |
| | Total | | | 295.2 | 295.2 | 295.2 | 295.2 | 295.2 | 295.2 |
| | Evaluation results (thickness of SR: 20 μm) | | Gloss value (%) | 10 | 15 | 20 | 90 | 10 | 30 |
| | | | Arithmetic average surface roughness Sa (μm) | 0.6 | 0.6 | 0.3 | 0.03 | 0.4 | 0.3 |
| | | | Opening diameter (φ200 μm) | φ170 μm | φ163 μm | φ100 μm | φ180 μm | φ100 μm | φ120 μm |
| | | | Insulation reliability (60° C., 95% RH) | Poor | Poor | Good | Excellent | Excellent | Good |

As shown in Table 1 above, the photosensitive dry film of each of Examples 1 to 7, having an irregular surface formed by chemical etching, on one surface of the support film, was excellent in Insulation reliability and resolution, and enabled a cured film having a frosted appearance to be formed. In particular, Examples 1 to 5 and 7, in which the arithmetic average surface roughness Sa of the Irregular surface of the support film was 0.3 to 0.7 μm, exhibited excellent insulation reliability, and Examples 1 to 4 and 7, In which the arithmetic average surface roughness Sa of the irregular surface of the support film was 0.3 to 0.6 μm, exhibited excellent resolution and Insulation reliability. Examples 2 to 6 and 7, in which the arithmetic average surface roughness Sa of the irregular surface of the support film was 0.4 to 0.8 μm, were able to exhibit a further excellent frosted appearance, a gloss value of 30% or less. Example 3 and Example 7 each were able to form a cured film being excellent in insulation reliability and resolution and having a frosted appearance even by compounding any of a bisphenol A-type epoxy resin, a biphenyl-type epoxy resin, and an alicylic epoxy resin, as the epoxy compound. Accordingly, it was found that the chemical structure of the epoxy compound to be compounded in the photosensitive resin composition was not particularly limited.

In contrast, as shown in Table 2 above, Comparative Example 1 using a coating matte film as the support film and Comparative Example 2 using a sand matte film as the support film were able to obtain a frosted appearance, but did not obtain insulation reliability. Comparative Example 3 using a kneaded matte film as the support film was able to obtain a frosted appearance, but did not obtain resolution. Comparative Example 6 using a matte film with one surface kneaded, as the support film, was able to obtain a frosted appearance, but did not obtain resolution. Comparative Example 5 in which both surfaces of the support film each had an irregular surface formed by chemical etching was able to obtain a frosted appearance, but did not obtain a resolution. Comparative Example 4 using a support film having an arithmetic average surface roughness Sa of 0.03 μm was not able to obtain a frosted appearance.

The photosensitive dry film of the present disclosure has an irregular surface formed by chemical etching, on one surface of a support film, to thereby enable a photocured film being excellent in insulation reliability and resolution and having a frosted appearance to be obtained, and is high in utility value in the field of, for example, an insulating protective film (solder resist film) to be provided on a printed wiring board.

What is claimed is:

1. A photosensitive dry film comprising a support film having a first main surface and a second main surface opposite to the first main surface, and a photosensitive resin layer provided on the first main surface, wherein the first main surface has an irregular surface formed by chemical etching, and wherein an arithmetic average surface roughness Sa of the irregular surface of the first main surface is 0.40 μm or more and 1.00 μm or less, wherein the photosensitive resin layer is formed from a photosensitive resin composition, and the photosensitive resin composition comprises an aliphatic-based urea compound (C), and wherein the aliphatic-based urea compound comprises a cyclic aliphatic structure.

2. The photosensitive dry film according to claim 1, wherein the second main surface is a smooth surface having an arithmetic average surface roughness Sa lower than the arithmetic average surface roughness Sa of the first main surface.

3. The photosensitive dry film according to claim 1, wherein the photosensitive resin composition further comprises a photosensitive resin (A), an epoxy compound (B), a reactive diluent (D), and a photopolymerization initiator (E).

4. The photosensitive dry film according to claim 3, wherein the epoxy compound (B) comprises at least one selected from a bisphenol A-type epoxy resin, a biphenyl-type epoxy resin and an alicyclic epoxy resin.

5. The photosensitive dry film according to claim 1, for use in formation of a solder resist film.

6. A method for producing a printed wiring board, comprising:

a step of bonding the photosensitive resin layer of the photosensitive dry film according to claim 1, to a printed wiring board, a step of applying ultraviolet light from above the support film of the photosensitive dry film, to photocure the photosensitive resin layer, a step of releasing the support film from the photosensitive dry film and developing the photosensitive resin layer photocured, to form a photocured film having a predetermined pattern, and a step of subjecting the photocured film having a predetermined pattern to a thermal curing treatment, to form a cured film having an irregular surface section, wherein an arithmetic average surface roughness Sa of the irregular surface section of the cured film is 0.40 μm or more and 1.00 μm or less.

* * * * *